(12) United States Patent
Giacomini

(10) Patent No.: US 9,871,495 B2
(45) Date of Patent: Jan. 16, 2018

(54) THERMAL COMPENSATION FOR AMPLIFIERS

(71) Applicant: Texas Instruments Incorporated, Dallas, TX (US)

(72) Inventor: Joseph Giacomini, Loveland, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/153,466

(22) Filed: May 12, 2016

(65) Prior Publication Data

US 2016/0336905 A1 Nov. 17, 2016

Related U.S. Application Data

(60) Provisional application No. 62/273,920, filed on Dec. 31, 2015, provisional application No. 62/160,277, filed on May 12, 2015.

(51) Int. Cl.
*H03F 3/45* (2006.01)
*H03G 5/24* (2006.01)

(52) U.S. Cl.
CPC ..... *H03F 3/45475* (2013.01); *H03F 3/45479* (2013.01); *H03G 5/24* (2013.01); *H03F 2200/447* (2013.01); *H03F 2203/45138* (2013.01)

(58) Field of Classification Search
CPC .................................. H03F 3/45; H03G 5/24
USPC ......................... 330/278, 282, 294
See application file for complete search history.

(56) References Cited

U.S. PATENT DOCUMENTS

| | | | | | |
|---|---|---|---|---|---|
| 3,753,139 | A * | 8/1973 | Spencer | ................... | H03F 1/30 330/110 |
| 5,408,697 | A * | 4/1995 | Price | ...................... | H03F 1/301 330/279 |
| 5,483,199 | A * | 1/1996 | Knudsen | ................. | H03F 1/302 330/289 |
| 5,532,648 | A * | 7/1996 | Culling | .................... | H03F 1/32 330/289 |
| 5,770,974 | A * | 6/1998 | Vogt | ....................... | H03F 1/307 330/271 |
| 6,226,136 | B1 * | 5/2001 | Chern | .................... | G11B 5/012 360/25 |
| 6,414,806 | B1 * | 7/2002 | Gowda | ................... | G11B 5/02 360/25 |

* cited by examiner

*Primary Examiner* — Patricia T Nguyen
(74) *Attorney, Agent, or Firm* — Goutham Kondapalli; Charles A. Brill; Frank D. Cimino

(57) ABSTRACT

Systems and methods for providing thermal compensation for amplifiers are described. In some embodiments, an electronic circuit may include a main amplifier and a thermal compensation circuit coupled to the main amplifier, the thermal compensation circuit configured to adjust a gain of the main amplifier at a first range of frequencies relative to the gain of the main amplifier at a second range of frequencies. For example, the thermal compensation circuit may be configured to reduce a self-heating effect within the main amplifier when the main amplifier is in operation, such that the first range of frequencies is lower than the second range of frequencies.

15 Claims, 4 Drawing Sheets

THERMAL COMPENSATION FOR AMPLIFIERS

CROSS-REFERENCE TO RELATED APPLICATION

This application claims the benefit of U.S. Provisional Application No. 62/273,920, filed Dec. 31, 2015, and of U.S. Provisional Application No. 62/160,277, filed May 12, 2015, the disclosures of which are incorporated herein by reference in their entirety.

TECHNICAL FIELD

This specification is directed, in general, to electronic circuits, and, more specifically, to systems and methods for providing thermal compensation for amplifiers.

BACKGROUND

The inventor hereof has determined that the self-heating of devices within an amplifier causes a long term settling tail in the amplifier's step response. This is particularly true for current feedback amplifiers; but it can also cause problems in other circuits. This self-heating phenomenon can change an amplifier's gain at low frequencies, which leads to a long term settling tail in a transient step response.

A known technique for reducing thermal effects in an amplifier includes adding a cascode to circuit elements that affect the amplifier's gain. This reduces the self-heating effect by limiting voltage swings. But it does not correct for changes in current, which are required for an amplifier to function properly, thus some self-heating may still exist.

In the case of a current feedback amplifier, for example, a cascode would have to be added to at least 4 different devices (or 8 devices for a differential configuration). And each cascode can reduce usable signal swing by approximately 0.8 V—which means that the input stage swing would be reduced to values that are unacceptable for most applications.

Another conventional thermal effect reduction technique includes using a voltage feedback amplifier which relies on ratios of resistances; not absolute current gain. Moreover, this method has a direct tradeoff between gain and bandwidth, and it is also impractical in many situations.

In sum, conventional methods for dealing with thermal effects in amplifiers have a strong negative impact on speed, dynamic performance, or both. To address these, and other problems, the inventor hereof has developed the various systems and methods for providing an electrical compensation method that compensates for the effects of thermal self-heating described herein.

SUMMARY

Systems and methods for providing thermal compensation for amplifiers are described. In an illustrative, non-limiting embodiment, an electronic circuit may include a main amplifier and a thermal compensation circuit coupled to the main amplifier, the thermal compensation circuit configured to adjust a gain of the main amplifier at a first range of frequencies relative to the gain of the main amplifier at a second range of frequencies.

For example, the thermal compensation circuit may be configured to reduce a self-heating effect within the main amplifier when the main amplifier is in operation. The first range of frequencies may be lower than the second range of frequencies.

The thermal compensation circuit may include a low-pass filter having: (a) an input terminal coupled to an output terminal of the main amplifier, and (b) an output terminal coupled to an input terminal of a secondary amplifier. The low-pass filter may be configured to select the first range of frequencies. The thermal compensation circuit may include a feedback resistor coupled to the input terminal of the low-pass filter and to an output terminal of the secondary amplifier. The output terminal of the secondary amplifier may be coupled to an inverting input of the main amplifier. The thermal compensation circuit may further include a gain resistor coupled to the output terminal of the secondary amplifier and to ground.

In another illustrative, non-limiting embodiment, a thermal compensation circuit configured to reduce a self-heating effect within the main amplifier when the main amplifier is in operation may include: a low-pass filter having an input terminal coupled to an output terminal of the main amplifier; and a secondary amplifier having (a) an input terminal coupled to an output of the low-pass filter, and (b) an output terminal coupled to an inverting input of the main amplifier.

A feedback path created by the thermal compensation circuit may be configured to adjust a gain of the main amplifier at a first range of frequencies to match another gain of the main amplifier at a second range of frequencies. The first range of frequencies may be lower than the second range of frequencies. The low-pass filter may be configured to select the first range of frequencies. A feedback resistor may be coupled to the input terminal of the low-pass filter and to the output terminal of the secondary amplifier. A gain resistor may be coupled to the output terminal of secondary amplifier and to ground.

In yet another illustrative, non-limiting embodiment, a method may include amplifying a signal using a main amplifier, where the main amplifier is subject to a self-heating effect of one or more internal devices; and reducing the self-heating effect by adjusting a gain of the main amplifier at a first range of frequencies to match the gain of the main amplifier at a second range of frequencies. For example, reducing the self-heating effect may include creating a feedback path between an output of the amplifier and an inverting input of the amplifier using a thermal compensation circuit.

The thermal cancellation circuit may include: a low-pass filter having an input terminal coupled to an output terminal of the main amplifier; a secondary amplifier having (a) an input terminal coupled to an output of the low-pass filter, and (b) an output terminal coupled to an inverting input of the main amplifier; and a feedback resistor coupled to the input terminal of the low-pass filter and to the output terminal of the secondary amplifier.

The method may also include selecting the first range of frequencies using the low-pass filter. The first range of frequencies may be lower than the second range of frequencies. The method may further include using a gain resistor coupled to the output terminal of secondary amplifier and to ground.

BRIEF DESCRIPTION OF THE DRAWINGS

Reference will now be made to the accompanying drawings, wherein.

DETAILED DESCRIPTION

Embodiments now will be described more fully hereinafter with reference to the accompanying drawings. The systems and methods described herein may, however, be embodied in many different forms and should not be construed as limited to the implementations set forth herein. Rather, these embodiments are provided so that this disclosure will be thorough and complete. A person of ordinary skill in the art will be able to make and use the various embodiments described herein.

As noted above, self-heating of devices causes a long term settling tail in step response of amplifiers (e.g., current feedback amplifiers), which degrades the amplifier's settling response time. Particularly, thermal changes create different signal gains between low and high frequencies—and these differences become very evident, for example, in the step response of an analog waveform fed through an amplifier.

To address these, and other problems, systems and methods described herein employ a thermal compensation circuit to provide a correction for this tail such that it can be reduced or eliminated, without slowing down or degrading the overall circuit performance. These systems and methods provide thermal compensation by extending the precision of even the fastest amplifier architectures while preserving their speed and dynamic performance at a very low impact on power consumption. In contrast, conventional techniques have significant impact on performance and require appreciable amounts of power.

Generally speaking, a thermal compensation circuit may be used to provide a small amount of positive or negative feedback, but only at low frequencies. Typically, thermal heating causes the gain to be lower at low frequencies, in that case the feedback is positive. However, if the heating source causes the opposite effect (e.g., due to different device physics or circuit structure), the low frequency gain may be too high, and negative feedback may be used instead to reduce or eliminate the error.

Figure 1:
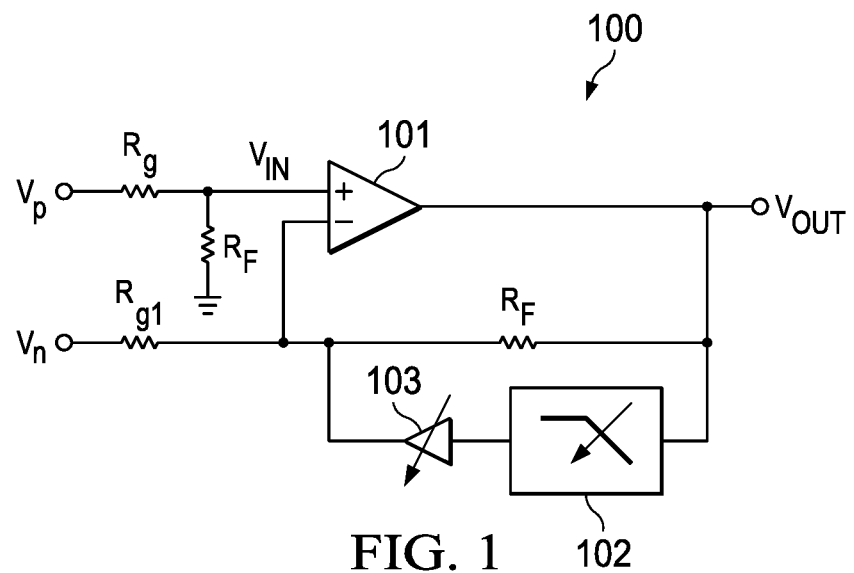
FIG. 1 is a circuit diagram of an example of an amplifier connected in a differential input to single ended output mode with gain according to some embodiments.

FIG. 1 is a circuit diagram of an example of differential input amplifier with gain according to some embodiments. Specifically, thermal compensation circuit 100 is coupled to main amplifier 101—in this case, a current feedback amplifier whose thermal behavior is to be corrected. A current feedback amplifier has two inputs; a non-inverting input and a low impedance inverting input. The "current feedback" is created by connecting the output of main amplifier 101 through a resistor to its low impedance, inverting input. In this manner, an electrical current that is fed back is given by the amplifier's output voltage minus the voltage at the inverting input divided by a feedback resistor (in this case, $R_F$), even when other resistors (such as $R_{g1}$ and $R_{g2}$ discussed below) are present.

Thermal compensation circuit 100 is configured to adjust a gain of main amplifier 101 at a first range of frequencies to match the gain of the main amplifier at a second range of frequencies to reduce the self-heating effects within main amplifier 101 when in operation. Moreover, the first range of frequencies is lower than the second range of frequencies.

Amplifier 101 receives first signal $V_p$ at its non-inverting input through a voltage divider comprising resistors $R_g$ and $R_F$. Amplifier 101 also receives second signal $V_n$ at its inverting input through $R_{g1}$, which has the same value as $R_g$. Feedback resistor $R_F$ is provided between the output of amplifier 101 and its inverting input.

Main amplifier 101 receives signal $V_{IN}$ at its non-inverting input and provides $V_{OUT}$ at its output. In circuit 100, the output voltage $V_{OUT}$ is given by:

$$V_{OUT} = (V_p - V_n) \cdot \frac{R_F}{Rg}$$

Thermal compensation circuit 100 includes low-pass filter 102 having: (a) an input terminal coupled to an output terminal of main amplifier 101, and (b) an output terminal coupled to an input terminal of secondary amplifier 103. Low-pass filter 102 may be adjustable and configured to select a first range of frequencies. For example, different aspects of low-pass filter 102 may be configurable, such as the corner frequency or the pass-band gain. In various embodiments, low-pass filter 102 may be configured when manufactured, by the customer, or during operation of thermal compensation circuit 100. Thermal compensation circuit 100 further includes feedback resistor $R_F$ coupled to the input terminal of low-pass filter 102 and to an output terminal of secondary amplifier 103. And the output terminal of secondary amplifier 103 is coupled to an inverting input of main amplifier 101.

In some implementations, thermal compensation circuit 100 may also include a gain resistor $R_G$ coupled to the output terminal of secondary amplifier 103 and to ground or to other signal inputs. In other implementations, $R_G$ may be sufficiently large ($\infty$) to provide a unity signal gain.

Figure 2:
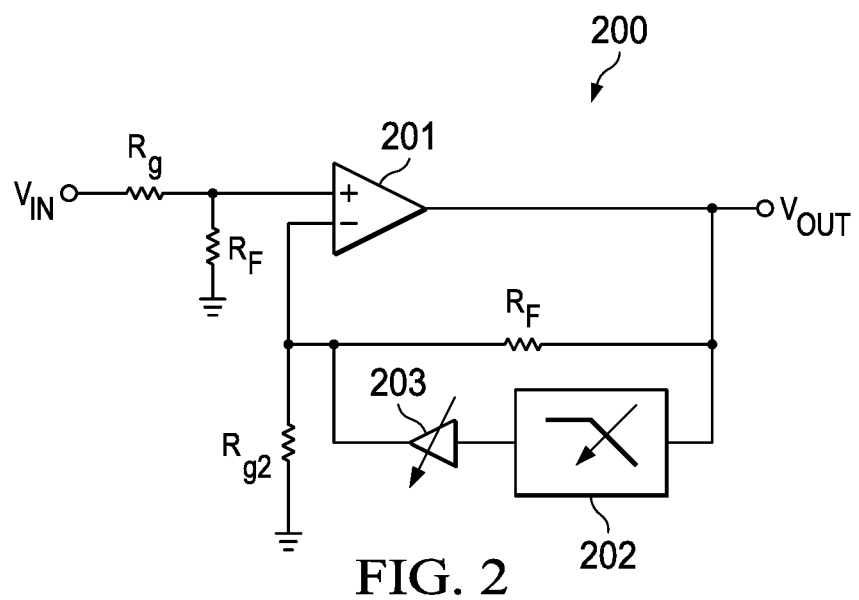
FIG. 2 is a circuit diagram of an example of a single ended amplifier with gain according to some embodiments.

FIG. 2 is a circuit diagram of an example of common single ended amplifier with gain according to some embodiments. Thermal compensation circuit 200 is coupled to main amplifier 201, which receives input signal $V_{IN}$ at its non-inverting input through a voltage divider comprising resistors $R_g$ and $R_F$. Feedback resistor $R_F$ is provided between the output of amplifier 101 and its inverting input, which is coupled to ground via $R_{g2}$.

Main amplifier 201 receives signal $V_{IN}$ at its non-inverting input and provides $V_{OUT}$ at its output. In circuit 200, $V_{OUT}$ is given by:

$$V_{OUT} = V_p \cdot \frac{R_F}{Rg}$$

Thermal compensation circuit 200 also includes low-pass filter 202 having: (a) an input terminal coupled to an output terminal of main amplifier 201, and (b) an output terminal coupled to an input terminal of secondary amplifier 203. The output terminal of secondary amplifier 203 is coupled to the inverting input of main amplifier 201.

Figure 3:
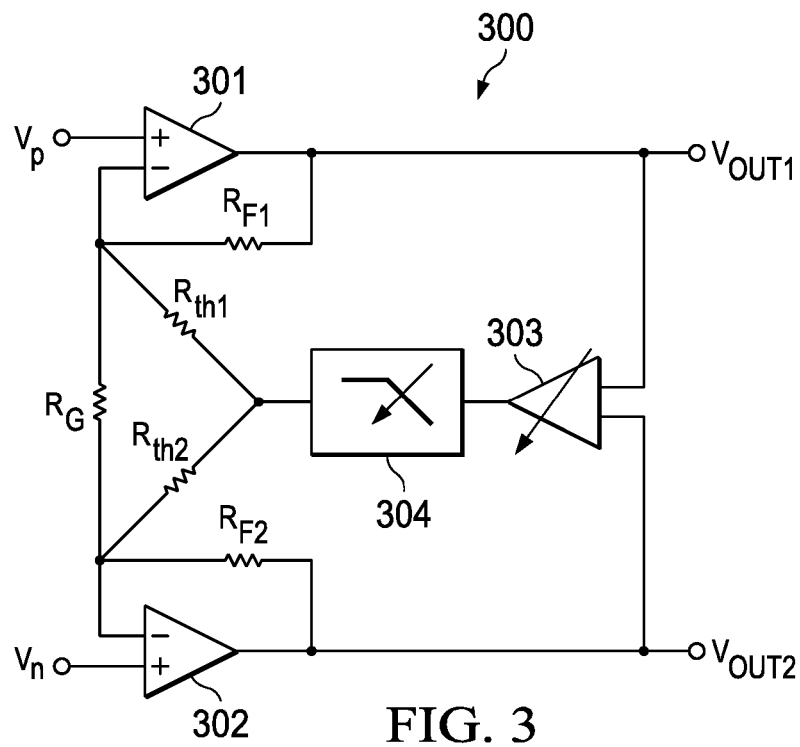
FIG. 3 is a circuit diagram of an example of a true difference amplifier with thermal feedback done using a voltage feedback according to some embodiments.

FIG. 3 is a circuit diagram of an example of a true difference amplifier with thermal feedback done using a voltage feedback method according to some embodiments. This circuit structure is preferred for high performance signal processing applications. In some cases, the circuit of FIG. 3 may be used as part of a differential current feedback amplifier, for example. Specifically, thermal compensation circuit 300 is coupled to main amplifiers 301 and 302. The non-inverting input of main amplifier 301 receives differential signal $V_p$ and the non-inverting input of main amplifier 302 receives differential signal $V_n$. Feedback resistor $R_{F1}$ is coupled between the output of main amplifier 301 and the inverting input of main amplifier 301, and feedback resistor $R_{F2}$ is coupled between the output of main amplifier 302 and the inverting input of main amplifier 302.

The output of main amplifier 301, which provides $V_{OUT1}$, is coupled to an input of secondary amplifier 303, and the output of main amplifier 302, which provides $V_{OUT2}$, is also coupled to another input of secondary amplifier 303. Low-pass filer 304 is coupled to the output of amplifier 303 and to resistors $R_{th1}$ and $R_{th2}$; which are coupled to the inverting inputs of main amplifiers 301 and 302, respectively. Also, thermal compensation circuit 300 may include gain resistor $R_G$ coupled to the inverting inputs of main amplifiers 301 and 302.

Figure 4:
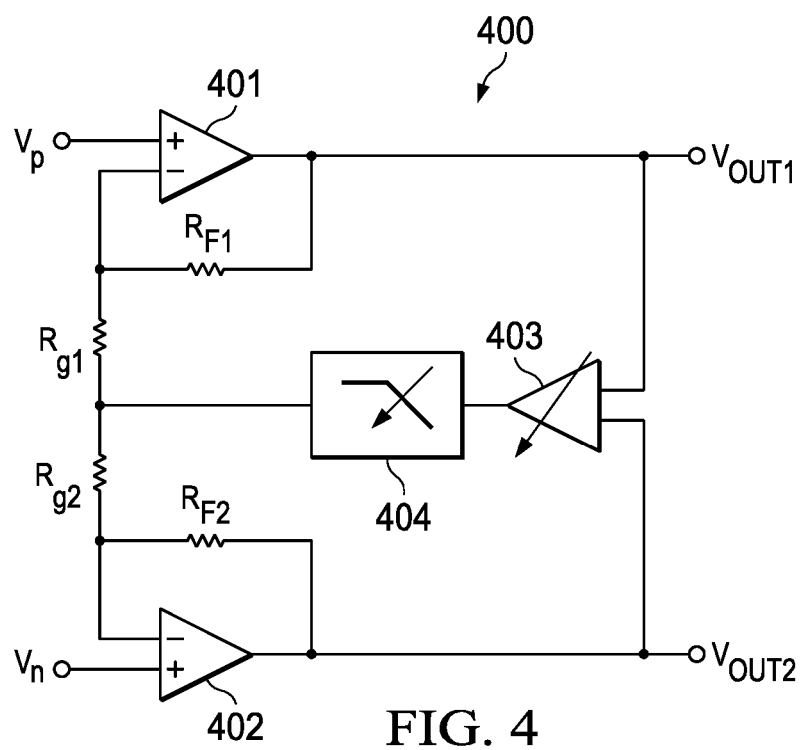
FIG. 4 is a circuit diagram of an example of a true difference amplifier using thermal feedback with a current feedback approach according to some embodiments.

FIG. 4 is a circuit diagram of an example of true difference amplifier using thermal feedback with a current feedback according to some embodiments. With a common feedback point this configuration has less impact on the main signal path and has better matching than in FIG. 3. Here thermal compensation circuit 400 is coupled to main amplifiers 401 and 402. The non-inverting input of main amplifier 401 receives differential signal $V_p$ and the non-inverting input of main amplifier 402 receives differential signal $V_n$. Feedback resistor $R_{F1}$ is coupled between the output of main amplifier 401 and the inverting input of main amplifier 401, and feedback resistor $R_{F2}$ is coupled between the output of main amplifier 402 and the inverting input of main amplifier 402.

The output of main amplifier 401, which provides $V_{OUT1}$, is coupled to an input of secondary amplifier 403, and the output of main amplifier 402, which provides $V_{OUT2}$, is also coupled to another input of secondary amplifier 403. Low-pass filter 404 is coupled to the output of amplifier 403 and to resistors $R_{g1}$ and $R_{g2}$; which are coupled to the inverting inputs of main amplifiers 401 and 402, respectively.

Figure 5:
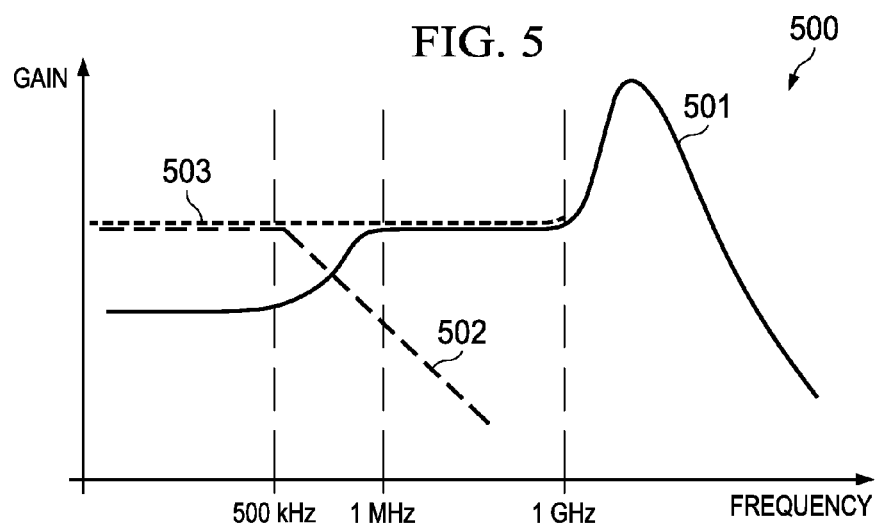
FIG. 5 is a graph showing a frequency response of an amplifier using a thermal compensation circuit according to some embodiments.

FIG. 5 is a graph showing a frequency response of an amplifier using a thermal compensation circuit, such as circuit 100 of FIG. 1, for example, according to some embodiments. Curve 501 shows the uncorrected frequency response of main amplifier 101, and curve 502 shows the feedback signal provided by thermal compensation circuit 100 into main amplifier 101.

Particularly, in this example, uncorrected response curve 501 is typical of main amplifier 101 in operation, where internal components self-heat and cause thermal changes that create different signal gains between low and high frequencies. In this example, the low frequency range (up to 500 kHz) of curve 501 is more attenuated than the high frequency range (between 1 MHz and 1 GHz). Accordingly, curve 502 is used to correct curve 501.

That is, curve 503 shows a corrected behavior of main amplifier 101, which is the result of the sum of curves 501 and 502. It should be noted that the resulting response curve 503 presents the same gain in the low frequency range as in the high frequency range up to 1 GHZ—that is, curve 503 is relatively flat across a wider frequency range, despite the thermal effects caused by the internal complements of main amplifier 101.

Figure 6:
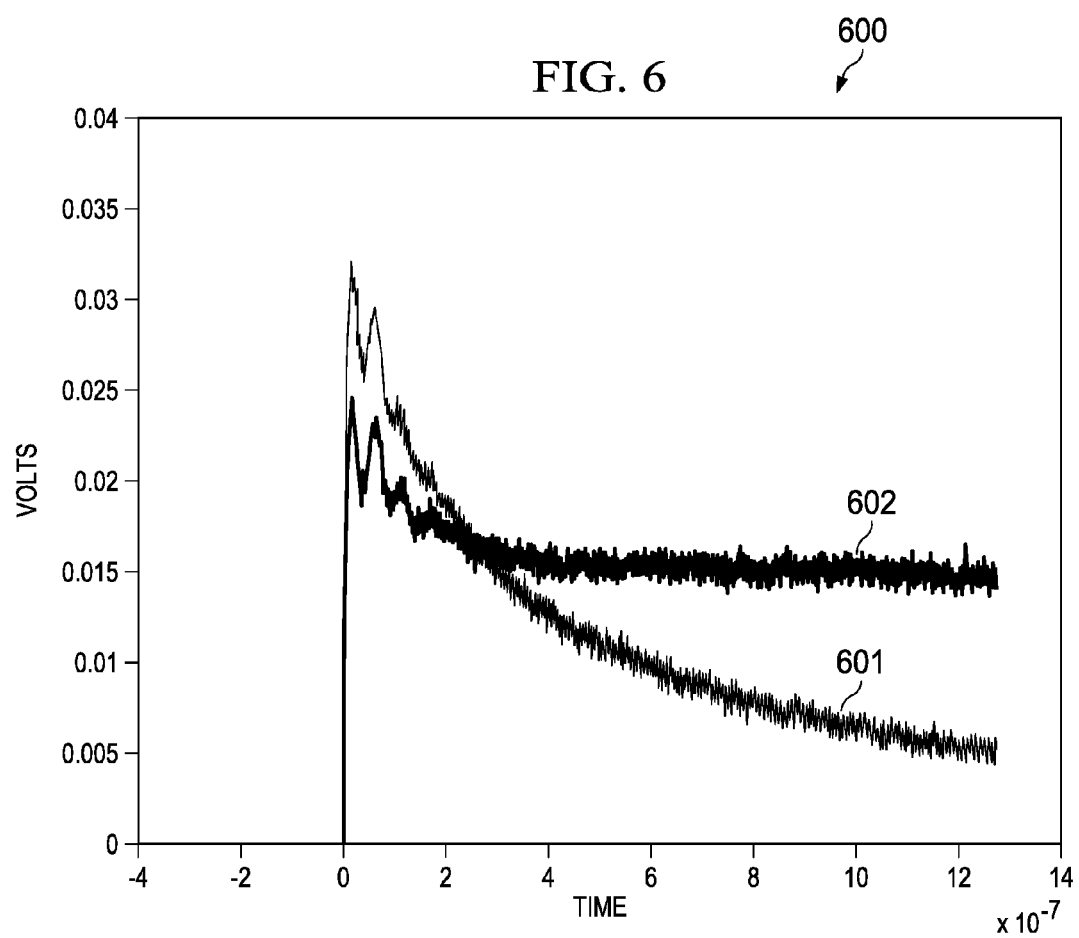
FIG. 6 is a graph showing a measured step response of an amplifier using a thermal compensation circuit according to some embodiments.

FIG. 6 is a graph showing a measured step response of amplifier 101 according to some embodiments. Particularly, curve 601 shows the step response of amplifier 100 without using thermal compensation circuit 100, and curve 602 shows the same response but employing circuit 100. It should be noted that, without the thermal tail correction, curve 601 shows the output voltage of amplifier 101 peaking at above 0.03 V and settling at 0.005 V, whereas curve 602 peaks at 0.025 V and settles at 0.015 V (when using circuit 100). Moreover, curve 602 settles much faster than curve 601.

Figure 7:
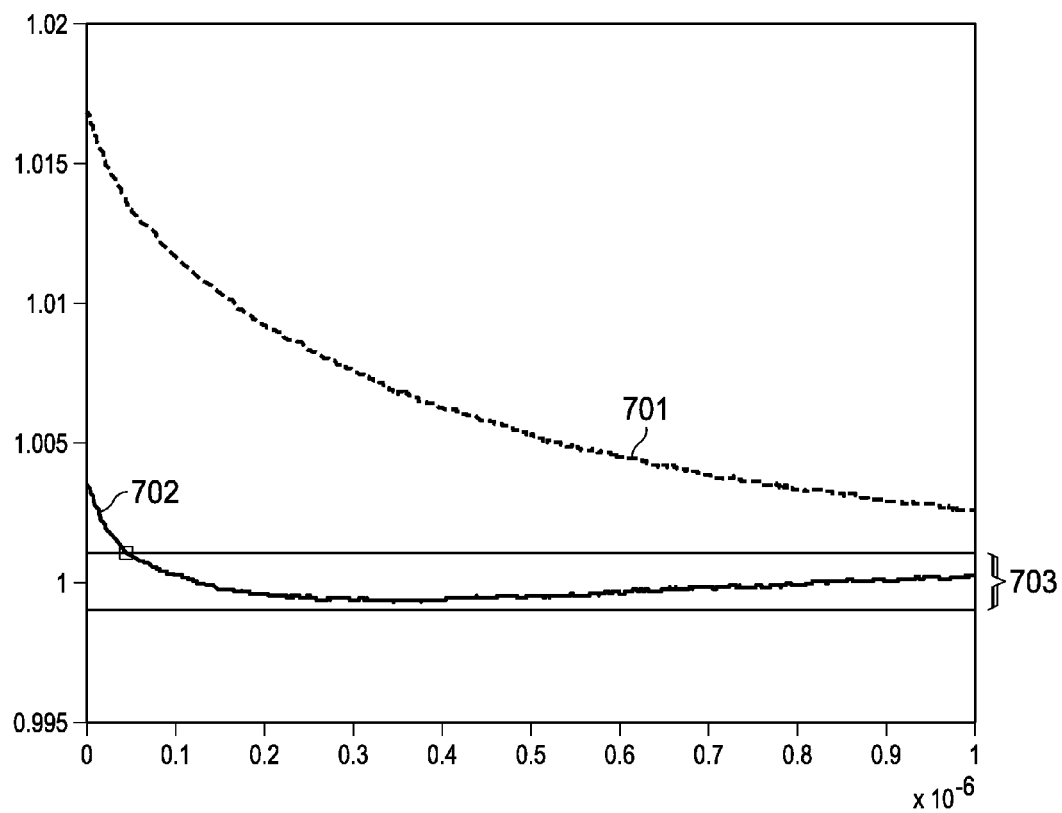
FIG. 7 is a graph showing a simulated settling response of an amplifier using a thermal compensation circuit according to some embodiments.

FIG. 7 is a graph showing a simulated settling response of amplifier 101 according to some embodiments. Particularly, curve 701 shows the settling response of amplifier 100 without using thermal compensation circuit 100, and curve 702 shows the same response but employing circuit 100. It should be noted that, without the thermal tail correction, curve 701 shows the output voltage of amplifier 101 settling slowly while curve 702 settles within specified voltage range 703 much faster.

In some implementations, the systems and methods described herein may be used with a digital controlled variable gain amplifier (DVGA) having a range of 32 dB in gain; which would make conventional thermal compensation solutions (e.g., voltage feedback) impractical. Moreover, these systems and methods have negligible effects on speed and dynamic performance, and requires very little extra supply current.

In various embodiments, electronic circuits described herein adjust the gain at low frequencies to match the high frequency gain. Circuits described herein provide a small amount of positive feedback at the frequency where needed (positive feedback is generally small and is only at low frequencies where there is not a significant concern with stability).

Several of the circuits described herein do not alter the amplifier's main signal path. These circuits can also be adjusted to accommodate process variation, board mounting differences and long term tails of other devices in the external signal chain. In other embodiments, circuits described herein may be used to compensate for other devices in the signal chain that may have long term settling tails due to either their own thermal issues or other gain variations due to other circuit element non-idealities. Moreover, these circuits can operate with very low power because the feedback bandwidth is low, and the required supply current is also very low (in contrast with cascode solutions which would require much higher currents to create stable high frequency reference voltages).

It should be understood that the various operations described herein may be implemented by processing circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

A person of ordinary skill in the art will appreciate that the various circuits depicted above are merely illustrative and is not intended to limit the scope of the disclosure described herein. In particular, a device or system configured to perform audio power limiting based on thermal modeling may include any combination of electronic components that can perform the indicated operations. In addition, the operations performed by the illustrated components may, in some embodiments, be performed by fewer components or distributed across additional components. Similarly, in other embodiments, the operations of some of the illustrated components may not be provided and/or other additional operations may be available. Accordingly, systems and methods described herein may be implemented or executed with other circuit configurations.

It will be understood that various operations discussed herein may be executed simultaneously and/or sequentially. It will be further understood that each operation may be performed in any order and may be performed once or repetitiously.

Many modifications and other embodiments will come to mind to a person of ordinary skill in the art to which such embodiments pertain having the benefit of the teachings presented in the foregoing descriptions, and the associated drawings. Therefore, it is to be understood that the embodiments are not to be limited to the specific implementations disclosed. Although specific terms are employed herein, they are used in a generic and descriptive sense only and not for purposes of limitation.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic circuit, comprising:
   a main amplifier comprising an input terminal and an output terminal; and
   a thermal compensation circuit coupled to the main amplifier, the thermal compensation circuit configured to adjust a gain of the main amplifier at a first range of frequencies relative to the gain of the main amplifier at a second range of frequencies, the thermal compensation circuit comprising:
   a low-pass filter having: (a) an input terminal coupled to the output terminal of the main amplifier, and (b) an output terminal coupled to an input terminal of a secondary amplifier, and
   a feedback resistor coupled to the input terminal of the low-pass filter and to an output terminal of the secondary amplifier.

2. The electronic circuit of claim 1, wherein the thermal compensation circuit is further configured to reduce a self-heating effect within the main amplifier when the main amplifier is in operation.

3. The electronic circuit of claim 1, wherein the first range of frequencies is lower than the second range of frequencies.

4. The electronic circuit of claim 1, wherein the low-pass filter is configured to select the first range of frequencies.

5. The electronic circuit of claim 4, wherein the output terminal of the secondary amplifier is coupled to an inverting input of the main amplifier.

6. The electronic circuit of claim 4, wherein the thermal compensation circuit further comprises a gain resistor coupled to the output terminal of the secondary amplifier and to ground.

7. A thermal compensation circuit, comprising:
   a low-pass filter having an input terminal coupled to an output terminal of a main amplifier;
   a secondary amplifier having (a) an input terminal coupled to an output terminal of the low-pass filter, and (b) an output terminal coupled to an inverting input of the main amplifier; and
   a feedback resistor coupled to the input terminal of the low-pass filter and to the output terminal of the secondary amplifier.

8. The thermal compensation circuit of claim 7, wherein a feedback path created by the thermal compensation circuit is configured to adjust a gain of the main amplifier at a first range of frequencies to match another gain of the main amplifier at a second range of frequencies.

9. The thermal compensation circuit of claim 8, wherein the first range of frequencies is lower than the second range of frequencies.

10. The thermal compensation circuit of claim 9, wherein the low-pass filter is configured to select the first range of frequencies.

11. The thermal compensation circuit of claim 7, further comprising a gain resistor coupled to the output terminal of secondary amplifier and to ground.

12. A method, comprising:
    amplifying a signal using a main amplifier, wherein the main amplifier is subject to a self-heating effect of one or more internal devices; and
    reducing the self-heating effect by adjusting a gain of the main amplifier at a first range of frequencies to match the gain of the main amplifier at a second range of frequencies by creating a feedback path between an output terminal of the main amplifier and an inverting input of the main amplifier using a thermal compensation circuit, wherein the thermal compensation circuit comprises:
    a low-pass filter having an input terminal coupled to an output terminal of the main amplifier;
    a secondary amplifier having (a) an input terminal coupled to an output terminal of the low-pass filter, and (b) an output terminal coupled to an inverting input of the main amplifier; and
    a feedback resistor coupled to the input terminal of the low-pass filter and to the output terminal of the secondary amplifier.

13. The method of claim 12, further comprising:
    selecting the first range of frequencies using the low-pass filter.

14. The method of claim 12, wherein the first range of frequencies is lower than the second range of frequencies.

15. The method of claim 13, wherein the thermal compensation circuit further comprises a gain resistor coupled to the output terminal of secondary amplifier and to ground.

\* \* \* \* \*